(12) United States Patent
Yoshinaga et al.

(10) Patent No.: US 11,567,830 B2
(45) Date of Patent: Jan. 31, 2023

(54) MEMORY SYSTEM

(71) Applicant: Kioxia Corporation, Tokyo (JP)

(72) Inventors: Yuma Yoshinaga, Yokohama Kanagawa (JP); Tomoya Kodama, Kawasaki Kanagawa (JP); Osamu Torii, Minato Tokyo (JP); Kenichiro Furuta, Shinjuku Tokyo (JP); Ryota Yoshizawa, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 60 days.

(21) Appl. No.: 17/184,166

(22) Filed: Feb. 24, 2021

(65) Prior Publication Data
US 2021/0279133 A1 Sep. 9, 2021

(30) Foreign Application Priority Data
Mar. 5, 2020 (JP) .............................. JP2020-037936

(51) Int. Cl.
| | |
|---|---|
| G11C 29/00 | (2006.01) |
| G06F 11/10 | (2006.01) |
| G06N 3/08 | (2006.01) |
| G06N 3/04 | (2006.01) |
| H03M 13/45 | (2006.01) |

(52) U.S. Cl.
CPC ........... *G06F 11/1068* (2013.01); *G06N 3/04* (2013.01); *G06N 3/08* (2013.01); *H03M 13/458* (2013.01)

(58) Field of Classification Search
CPC ........ G06F 11/1068; G06N 3/04; G06N 3/08; H03M 13/458
See application file for complete search history.

(56) References Cited

U.S. PATENT DOCUMENTS

| | | |
|---|---|---|
| 9,749,089 B2 | 8/2017 | Millar et al. |
| 10,361,712 B2 | 7/2019 | Blaettler et al. |
| 2006/0116873 A1* | 6/2006 | Hetherington ...... G10L 21/0208 704/226 |
| 2019/0097653 A1* | 3/2019 | Zhang ............... H03M 13/3707 |
| 2019/0288878 A1 | 9/2019 | Shen et al. |

OTHER PUBLICATIONS

Fei Liang et al., "An Iterative BP-CNN Architecture for Channel Decoding," arXiv: 1707.05697v1, Jul. 2017, pgs. (30 total).

* cited by examiner

*Primary Examiner* — Samir W Rizk
(74) *Attorney, Agent, or Firm* — Foley & Lardner LLP

(57) ABSTRACT

A memory system includes a non-volatile memory and a memory controller. The memory controller is configured to read a received word from the non-volatile memory, estimate noise by using a plurality of different models for estimating the noise included in the received word to obtain a plurality of noise estimation values, select one noise estimation value from the plurality of noise estimation values, update the received word by using a value obtained by subtracting the selected noise estimation value from the read received word, and decode the updated received word by using a belief-propagation method.

16 Claims, 6 Drawing Sheets

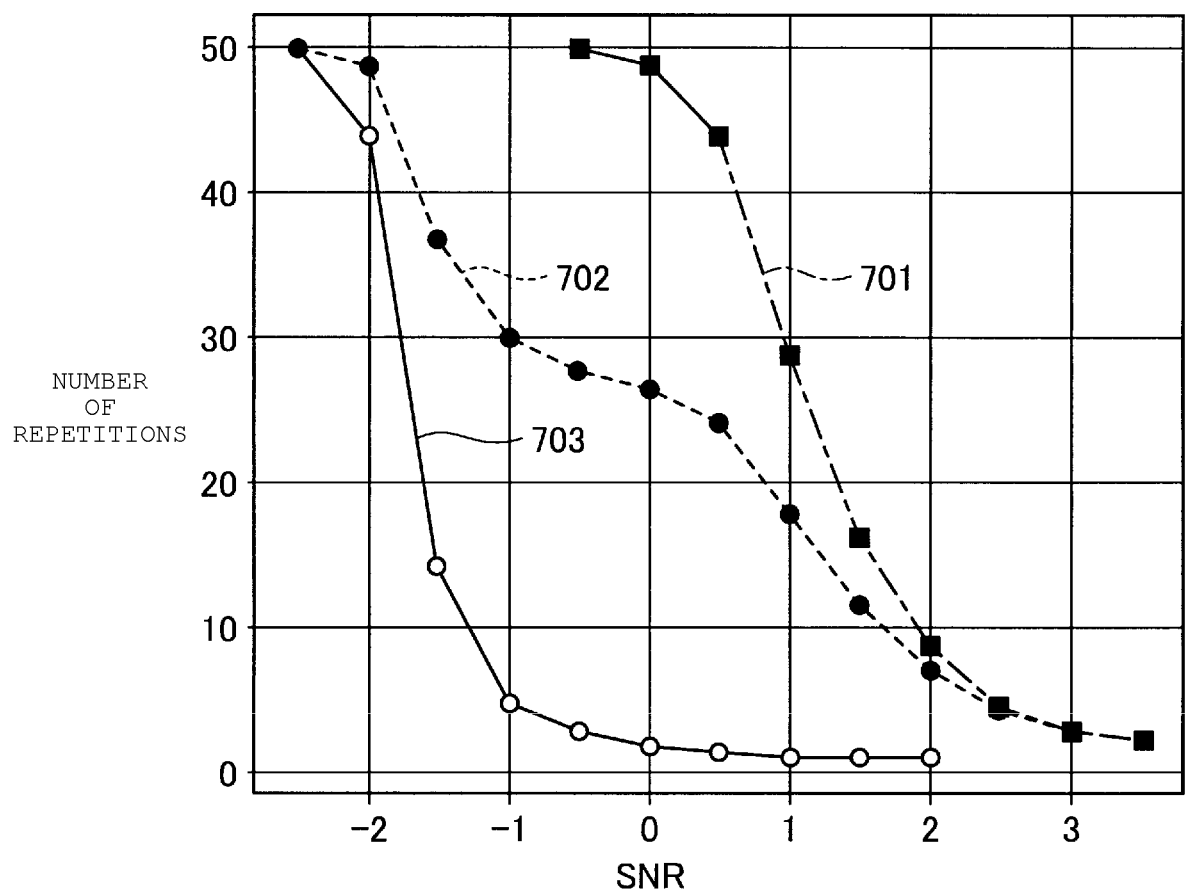

MEMORY SYSTEM

CROSS-REFERENCE TO RELATED APPLICATION

This application is based upon and claims the benefit of priority from Japanese Patent Application No. 2020-037936, filed Mar. 5, 2020, the entire contents of which are incorporated herein by reference.

FIELD

Embodiments described herein relate generally to a memory system.

BACKGROUND

Generally, a memory system stores error correction encoded data to protect the stored data. Therefore, when reading the data stored in the memory system, the error correction encoded data is decoded.

DESCRIPTION OF THE DRAWINGS

FIG. 7 is a diagram illustrating an example of the number of repetitions of BP decoding according to the second embodiment.

DETAILED DESCRIPTION

At least one embodiment provides a memory system which can increase error correction (decoding) capability.

In general, according to at least one embodiment, a memory system includes a non-volatile memory and a memory controller. The memory controller is configured to read a received word from the non-volatile memory, estimate noise by using a plurality of different models for estimating the noise included in the received word to obtain a plurality of noise estimation values, select one noise estimation value from the plurality of noise estimation values, update the received word by using a value obtained by subtracting the selected noise estimation value from the read received word, and decode the updated received word by using a belief-propagation method.

A memory system according to embodiments will be described in detail with reference to the accompanying drawings. The present disclosure is not limited to the embodiments which will be described below.

First Embodiment

Figure 1:
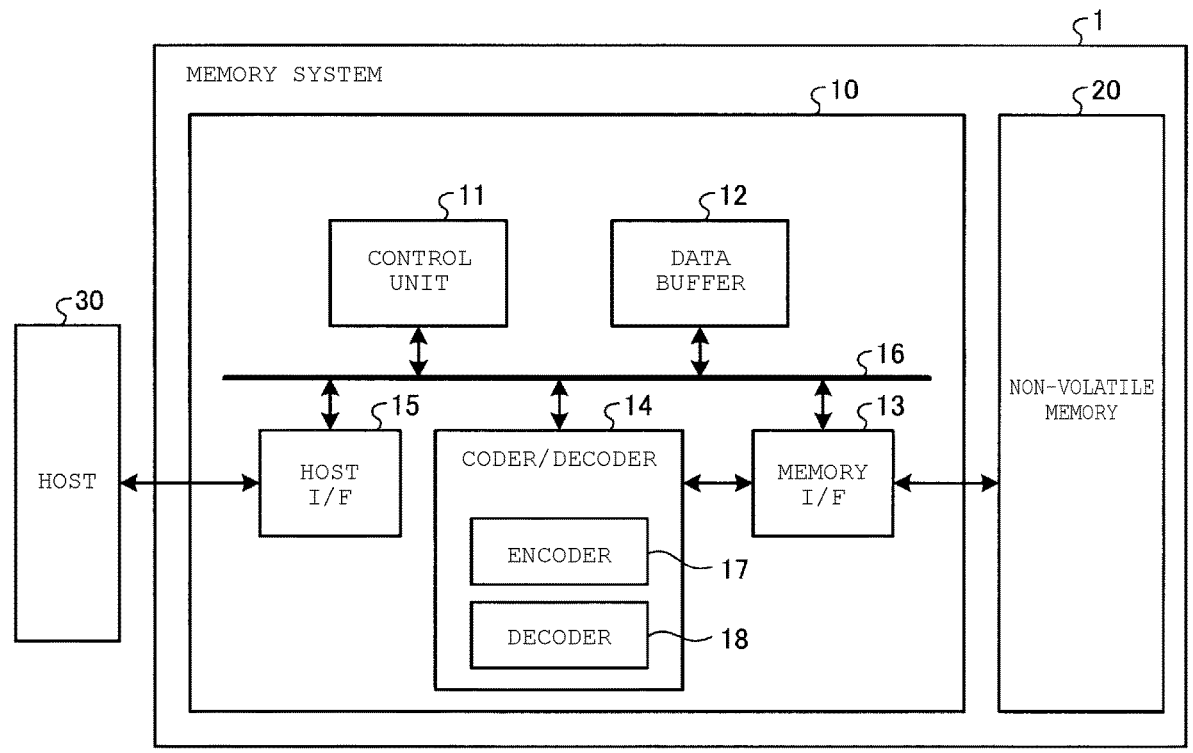
FIG. 1 is a block diagram illustrating a schematic configuration example of a memory system according to a first embodiment.

First, a memory system according to a first embodiment will be described in detail with reference to the drawings. FIG. 1 is a block diagram illustrating a schematic configuration example of a memory system according to the first embodiment. As illustrated in FIG. 1, a memory system 1 includes a memory controller 10 and a non-volatile memory 20. The memory system 1 can be connected to a host 30, and FIG. 1 illustrates a state in which the memory system. 1 is connected to the host 30. The host 30 may be, for example, an electronic device such as a personal computer or a mobile terminal.

The non-volatile memory 20 is a non-volatile memory that stores data non-volatilely, and is, for example, a NAND flash memory (hereinafter, simply referred to as a NAND memory). In the following description, a case where a NAND memory is used as the non-volatile memory 20 will be described, but a storage device other than a NAND memory such as a three-dimensional structure flash memory, a resistive random access memory (ReRAM), or a ferroelectric random access memory (FeRAM) can also be used as the non-volatile memory 20, for example. Further, it is not essential that the non-volatile memory 20 is a semiconductor memory, and at least one embodiment may also be applied to various storage media other than the semiconductor memory.

The memory system 1 may be various memory systems including the non-volatile memory 20, such as a so-called solid state drive (SSD) or a memory card in which the memory controller 10 and the non-volatile memory 20 are configured as one package.

The memory controller 10 controls writing to the non-volatile memory 20 according to a write request from the host 30. Further, the memory controller 10 controls reading from the non-volatile memory 20 according to a read request from the host 30. The memory controller 10 is a semiconductor integrated circuit configured as, for example, a system on chip (SoC). The memory controller 10 includes a host interface (I/F) 15, a memory interface (I/F) 13, a control unit 11, a coder/decoder (codec) 14, and a data buffer 12. The host I/F 15, the memory I/F 13, the control unit 11, the coder/decoder 14, and the data buffer 12 are connected to each other by an internal bus 16. Part or all of operations of respective elements of the memory controller 10 to be described below may be implemented by a central processing unit (CPU) executing the firmware or may be implemented by hardware.

The host I/F 15 performs a process according to an interface standard with the host 30 and outputs a command received from the host 30, user data to be written, and the like to the internal bus 16. Further, the host I/F 15 transmits the user data read from the non-volatile memory 20 and restored, a response from the control unit 11, and the like to the host 30.

The memory I/F 13 performs a write operation to the non-volatile memory 20 based on an instruction of the control unit 11. Further, the memory I/F 13 performs a read operation from the non-volatile memory 20 based on an instruction of the control unit 11.

The control unit 11 comprehensively controls the respective elements of the memory system 1. When receiving a command from the host 30 via the host I/F 15, the control unit 11 performs control according to the command. For example, the control unit 11 instructs the memory I/F 13 to write user data and a parity to the non-volatile memory 20 according to a command from the host 30. Further, the control unit 11 instructs the memory I/F 13 to read the user data and a parity from the non-volatile memory 20 according to a command from the host 30.

Further, when receiving a write request from the host 30, the control unit 11 determines a storage area (memory area)

on the non-volatile memory 20 for the user data stored in the data buffer 12. That is, the control unit 11 manages a write destination of the user data. Correspondence between a logical address of the user data received from the host 30 and a physical address indicating the storage area on the non-volatile memory 20 in which the user data is stored is stored as an address conversion table.

When receiving a read request from the host 30, the control unit 11 converts the logical address designated by the read request into a physical address by using the address conversion table described above, and instructs the memory I/F 13 to perform reading from the physical address.

Generally, a NAND memory performs writing and reading in data units called pages and performs erasing in data units called blocks. In at least one embodiment, a plurality of memory cells connected to the same word line are referred to as a memory cell group. When a memory cell is a single-level cell (SLC), one memory cell group corresponds to one page. When the memory cell is a multi-level cell (MLC), one memory cell group corresponds to a plurality of pages. In the present description, the MLC includes a triple-level cell (TLC), a quad-level cell (QLC), and the like. Further, each memory cell is connected to a word line and a bit line. Thus, each memory cell can be identified by an address for identifying the word line and an address for identifying the bit line.

The data buffer 12 temporarily stores user data received from the host 30 by the memory controller 10 until being stored in the non-volatile memory 20. Further, the data buffer 12 temporarily stores user data read from the non-volatile memory 20 until being transmitted to the host 30. For example, a general-purpose memory such as static random access memory (SRAM) or dynamic random access memory (DRAM) may be used for the data buffer 12. The data buffer 12 may be mounted outside the memory controller 10 without being built in the memory controller 10.

The user data transmitted from the host 30 is transferred to the internal bus 16 and temporarily stored in the data buffer 12. The coder/decoder 14 encodes the user data stored in the non-volatile memory 20 to generate a code word. Further, the coder/decoder 14 decodes a received word read from the non-volatile memory 20 and restores the user data. Therefore, the coder/decoder 14 includes an encoder 17 and a decoder 18. Data encoded by the coder/decoder 14 may include control data or the like used in the memory controller 10 in addition to the user data.

Next, a write operation of at least one embodiment will be described. The control unit 11 instructs the encoder 17 to encode user data when writing the user data to the non-volatile memory 20. In this case, the control unit 11 determines a storage location (storage address) of a code word in the non-volatile memory 20 and also instructs the memory I/F 13 of the determined storage location.

The encoder 17 encodes the user data of the data buffer 12 and generates a code word based on an instruction from the control unit 11. The encoding method may include, for example, a coding method of using an algebraic code such as a Bose-Chaudhuri-Hocquenghem (BCH) code and a Reed-Solomon (RS) code, a coding method (such as a product code) of using the codes as a component code in a row direction and a column direction, and a coding method of using a code based on a sparse graph such as a low-density parity-check (LDPC) code. The memory I/F 13 performs a control of storing a code word in a storage location on the non-volatile memory 20 instructed by the control unit 11.

Next, a process in reading from the non-volatile memory 20 according to at least one embodiment will be described. When reading from the non-volatile memory 20, the control unit 11 designates an address on the non-volatile memory 20 and instructs the memory I/F 13 to read. Further, the control unit 11 instructs the decoder 18 to start decoding. The memory I/F 13 reads a received word from the designated address of the non-volatile memory 20 according to an instruction of the control unit 11 and inputs the read received word to the decoder 18. The decoder 18 decodes the received word read from the non-volatile memory 20.

Figure 2:
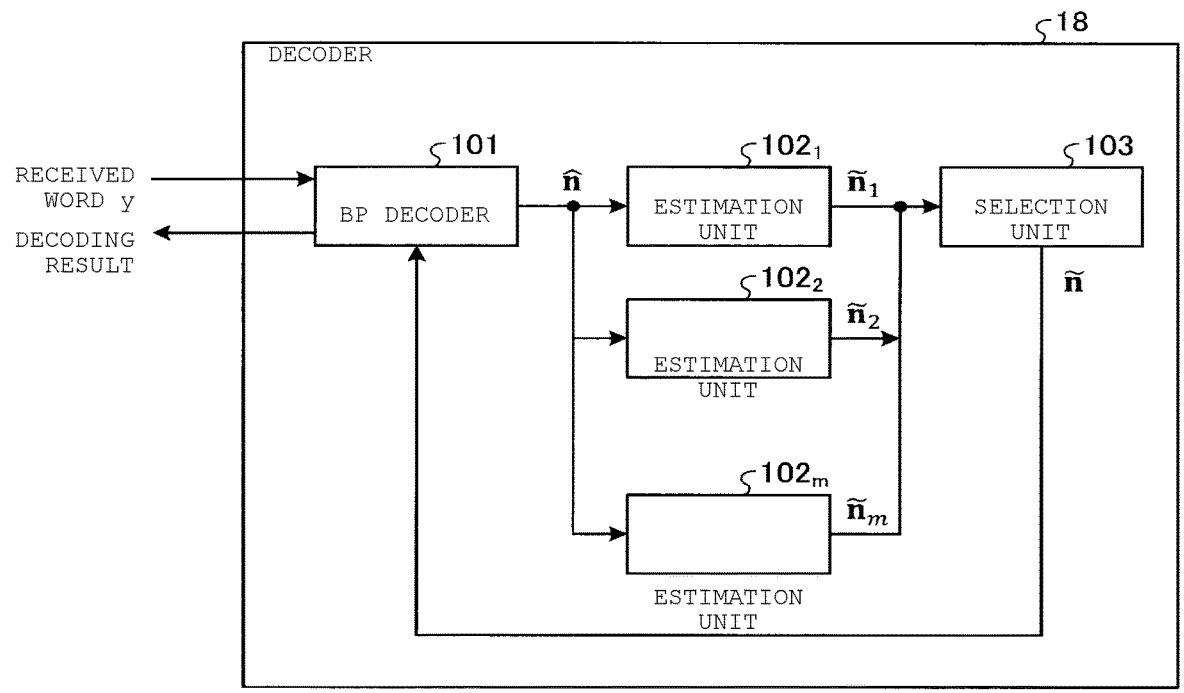
FIG. 2 is a block diagram illustrating a configuration example of a decoder according to the first embodiment.

The decoder 18 decodes the received word read from the non-volatile memory 20. FIG. 2 is a block diagram illustrating a configuration example of a decoder according to at least one embodiment. As illustrated in FIG. 2, the decoder 18 includes a BP decoder 101, an estimation unit $102_1$ to $102_m$ (m is an integer of 2 or more), and a selection unit 103.

The BP decoder 101 decodes a received word read from the non-volatile memory 20 by a belief-propagation method (BP).

Figure 3:
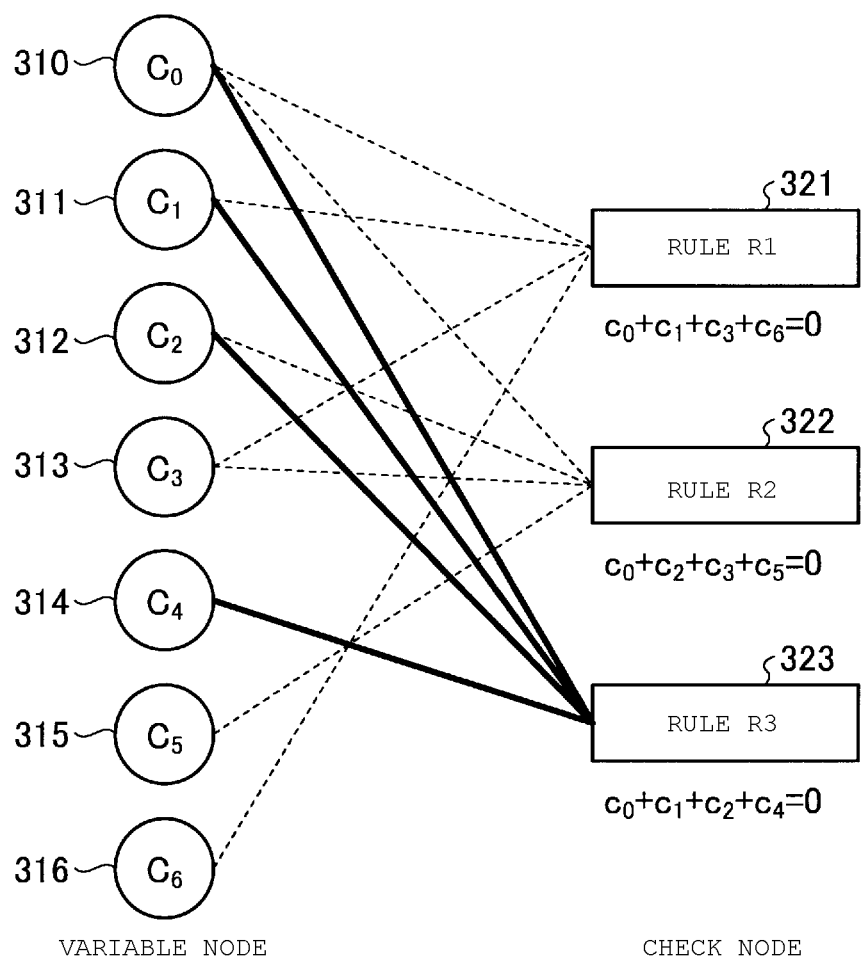
FIG. 3 is a diagram illustrating an example of a Tanner graph used for a belief-propagation method.

An outline of the belief-propagation method will be described below. FIG. 3 is a diagram illustrating an example of a Tanner graph used for the belief-propagation method. An applicable graph is not limited to the Tanner graph, and a bipartile graph such as a factor graph may be used. The Tanner graph can be interpreted as a graph representing a rule structure that a code to be decoded has to satisfy. FIG. 3 is an example of a Tanner graph for a 7-bit Hamming code (an example of a code word).

Variable nodes 310 to 316 correspond to code bits $C_0$ to $C_6$ of 7 bits. Check nodes 321 to 323 correspond to three rules R1, R2, and R3. The code bits are not limited to 7 bits. In addition, the number of rules is not limited to 3. In FIG. 3, a rule is used that a value becomes 0 when all the connected code bits are added. For example, the rule R3 indicates a rule that the added value of the code bits $C_0$, $C_1$, $C_2$ and $C_4$ corresponding to the variable nodes 310, 311, 312, and 314 connected to the corresponding check node 323 becomes 0.

In the belief-propagation method, for example, soft decision decoding of using a Tanner graph is performed. The soft decision decoding is a decoding method in which information indicating a probability that each code bit is 0 is inputted. For example, a log-likelihood ratio (LLR) in which a ratio between a likelihood of having a code bit of 0 and a likelihood of having a code bit of 1 is represented as a logarithm is used as an input for soft decision decoding.

In soft decision decoding on the Tanner graph, each variable node passes the LLR between other variable nodes via a check node. It is finally determined whether a code bit of each variable node is 0 or 1. The LLR passed by doing so is an example of a message delivered by the belief-propagation method.

For example, soft decision decoding on the Tanner graph is performed by the following sequence.

(S1) A variable node transmits an input LLR (channel LLR) to a connected check node.

(S2) The check node determines and returns an LLR of a variable node of a transmission source to each variable node (transmission source) based on an LLR of other connected variable nodes and a corresponding rule.

(S3) The variable node updates an LLR of own node based on the LLR returned from the check node and a channel LLR and transmits the LLR to the check node.

The variable node determines whether the code bit corresponding to the own node is 0 or 1 based on the LLR obtained after repeating (S2) and (S3).

The BP decoder 101 receives the received word y (soft decision value) read by a soft bit read and decodes the received word y by using the belief-propagation method. The soft bit read is a method of reading a received word (soft decision value) as information on a probability whether each bit configuring data to be read is 0 or 1. As described above, the belief-propagation method uses LLR as an input. Accordingly, the BP decoder 101 calculates an LLR from the received word y which is a soft decision value, and uses the calculated value as an input for the soft decision decoding described above. For example, the BP decoder 101 calculates the LLR from the received word y with reference to information (a table or the like) that defines correspondence between the soft decision value and the LLR. The BP decoder 101 outputs a decoding result obtained by the belief-propagation method. Hereinafter, the decoding result is represented by "s^" with "hat (^)" added after "s".

The estimation units $102_1$ to $102_m$ estimate noise included in the received word, estimate noise by using models different from each other, and obtain a noise estimation value. Hereinafter, the noise estimation value is represented by "n~" with "tilde (~)" added after "n". Further, in a mathematical equation, "tilde (~)" is added above "n" to represent the noise estimation value.

The model is represented by, for example, a convolutional neural network (CNN). Hereinafter, an example of using CNN as a model will be mainly described. The CNN is learned such that noise obtained by, for example, a difference between the received word y and a decoding result s^ is inputted and a noise estimation value is outputted. A noise n^ to be inputted is represented by, for example, following Equation (1).

$$n\hat{} = y - s\hat{} \quad (1)$$

The CNN may be learned such that an error (difference between the noise to be inputted and a noise estimation value to be outputted) of the noise estimation value follows a normal distribution. Thereby, it is possible to further increase a noise estimation accuracy when there is a correlation between the noises.

The estimated noise estimation value is used to update the received word y. Further, the updated received word is further used for decoding by the BP decoder 101. By using the received word updated as such, an accuracy of decoding by the BP decoder 101 can be increased.

A model for estimating noise may be a model specialized for noise assumed by learning data used for learning. Accordingly, a noise estimation accuracy for a received word to which noise having properties different from the noise assumed by learning data is added, may decrease, and as a result, a decoding accuracy by the BP decoder 101 may also decrease.

Therefore, the decoder 18 according to at least one embodiment obtains a plurality of noise estimation values by using a plurality of models different from each other. The decoder 18 selects an optimum noise estimation value from a plurality of the obtained noise estimation values and uses the obtained noise estimation values for updating the received word y.

For example, the estimation units $102_1$ to $102_m$ respectively estimate noise estimation values "$n_1$~" to "$n_m$~" by using mutually different CNNs, which are learned by using learning data in which noises having different properties are assumed.

Each CNN may be learned by using attribute information indicating attribute of the non-volatile memory 20. v is, for example, at least one of the number of word lines, the number of blocks, or the number of pages of the non-volatile memory 20. For example, each CNN may be configured to input attribute information in addition to noise and output a noise estimation value. Each CNN is learned by inputting noise to which different attribute information is added as learning data. By using a plurality of models learned by using the learning data with different pieces of attribute information, noise can be estimated with higher accuracy under various stress conditions, and as a result, a success rate of decoding can be increased.

Each CNN may be learned by using a decoding result when a hard error is generated as learning data. The learning data may include the decoding result obtained by simulating occurrence of a hard error. Thereby, it is possible to increase a noise estimation accuracy when the hard error is generated.

At the time of estimation, the estimation units $102_1$ to $102_m$ inputs the attribute information of the non-volatile memory 20 from which the received word y is read to a corresponding model together with noise obtained by a difference between the received word y and the decoding result s^, and estimates a noise estimation value.

The selection unit 103 selects one noise estimation value from the estimated noise estimation values "$n_1$~" to "$n_m$~". For example, the selection unit 103 selects a noise estimation value (for example, a noise estimation value in which a distance is minimized) in which a distance (Manhattan distance) between a value obtained by subtracting the noise estimation value from the received word y and a most likely decoding word is smaller than other noise estimation values. Following Equation (2) is an example of an equation for calculating a distance. N represents the number of bits included in a received word. $y_i$ represents an $i^{th}$ bit among the bits included in the received word y. "$n_{j,i}$~" represents $i^{th}$ bit among the bits included in $j^{th}$ noise estimation value "$n_j$~" (1≤j≤n).

$$\tilde{n} = \arg\min_{\tilde{n}_j} \left( \sum_{i=1}^{N} \min(|y_i - \tilde{n}_{j,i} - 1|, |y_i - \tilde{n}_{j,i} + 1|) \right) \quad (2)$$

Equation (2) corresponds to an equation obtaining the noise estimation value "n~" that minimizes the sum of the minimum values among a distance to the most likely decoding word "1" and a distance to the most likely decoding word "−1". A criterion of selection is not limited thereto. For example, the selection unit 103 may select a noise estimation value that is smaller than other noise estimation values.

The BP decoder 101 further performs decoding by the belief-propagation method by using a received word updated by the selected noise estimation value. For example, the BP decoder 101 updates the received word with a value obtained by subtracting the selected noise estimation value "n-" from the read received word y, and uses the updated received word, and repeats decoding by using the belief-propagation method.

With this configuration, a received word updated by using noise estimated with higher accuracy can be used and thus, it is possible to increase an accuracy of decoding by the belief-propagation method.

Figure 4:
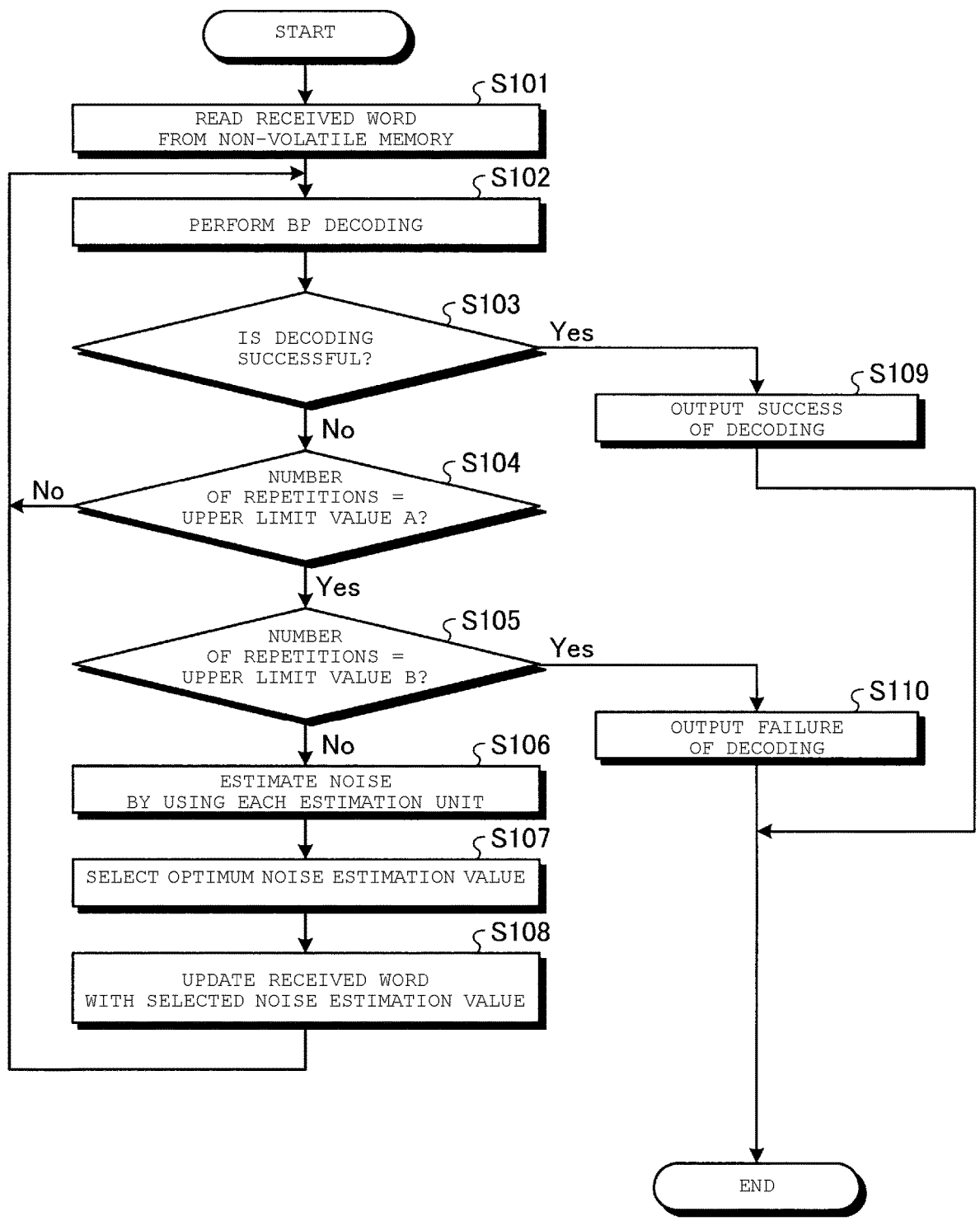
FIG. 4 is a flowchart illustrating an example of a data read processing according to the first embodiment.

FIG. 4 is a flowchart illustrating an example of a data read processing according to the first embodiment. The control unit 11 instructs the memory I/F 13 to read data from the non-volatile memory 20 by soft bit read by designating an address to be read, and the memory I/F 13 performs the soft bit read (step S101). The read received word y of a soft decision value is inputted to the decoder 18 of the coder/decoder 14, for example, via the internal bus 16.

The BP decoder 101 in the decoder 18 performs decoding (BP decoding) by using the belief-propagation method using the inputted received word y (step S102). The decoding corresponds to, for example, one process among repetition of the steps (S2) and (S3). The BP decoder 101 determines whether or not the BP decoding is successful (step S103). For example, the BP decoder 101 calculates a syndrome from a decoding result and a parity check matrix, and when all the syndrome values are 0, the BP decoder 101 determines that the decoding is successful.

If decoding is successful (step S103: Yes), the decoder 18 notifies, for example, the control unit 11 of the success of decoding (step S109). The control unit 11 outputs the decoding result to the host 30 via the host I/F 15.

If decoding fails (step S103: No), the decoder 18 determines whether or not the number of repetitions of BP decoding reaches an upper limit value A (for example, 25 times) (step S104). The number of repetitions of BP decoding is the number of repetitions of processes such as (S2) and (S3) described above. When the number of repetitions of BP decoding does not reach the upper limit value A (step S104: No), the process returns to step S102, and the BP decoding (S2 and S3) is further repeated.

When the number of repetitions of BP decoding reaches the upper limit value A (step S104: Yes), the decoder 18 further determines whether or not the number of repetitions of BP decoding reaches an upper limit value B (for example, 50 times) greater than the upper limit value A (step S105).

The upper limit value A corresponds to an upper limit value used for estimating noise and updating a received word by the estimated noise after repetition of the BP decoding is stopped. Meanwhile, the upper limit value B corresponds to an upper limit value used to terminate the process as a decoding failure when the decoding is not successful even if the BP decoding and updating of the received word are repeated.

When it is determined that the number of repetitions reaches the upper limit value B (step S105: Yes), the decoder 18 notifies, for example, the control unit 11 of the decoding failure (step S110). When the number of repetitions does not reach the upper limit value B (step S105: No), each of the plurality of estimation units $102_1$ to $102_m$ estimates noise by using a corresponding model and outputs the noise estimation value (step S106).

The selection unit 103 selects an optimum noise estimation value from the plurality of noise estimation values "$n_1\sim$" to "$n_m\sim$" output from each of the plurality of estimation units $102_1$ to $102_m$ (step S107). For example, the selection unit 103 selects the noise estimation value "$n\sim$" in which a distance in Equation (2) described above is minimized.

The BP decoder 101 updates the received word with the selected noise estimation value "$n\sim$" (step S108). For example, the BP decoder 101 calculates the received word $\hat{y}$ updated by following Equation (3).

$$\hat{y} = y - (n\sim) \quad (3)$$

Thereafter, the process returns to step S102, and the BP decoder 101 performs decoding again by using the belief-propagation method and using the updated received word $\hat{y}$.

As described above, in at least one embodiment, noise can be estimated with higher accuracy by using a plurality of models learned by using learning data having different stress conditions (attribute information of a non-volatile memory, and the like). Further, a success rate of decoding can be increased by using a received word updated by estimated noise.

Second Embodiment

In the first embodiment, decoding is first performed by using a belief-propagation method, and when the decoding fails, a noise estimation process is performed by an estimation unit. In a second embodiment, a noise estimation process is performed before decoding is performed by the belief-propagation method. Then, decoding using the belief-propagation method is performed by using a received word updated with estimated noise.

A schematic configuration of a memory system according to the second embodiment is the same as the schematic configuration of the memory system according to the first embodiment illustrated in FIG. 1. In the second embodiment, a function of the decoder is different from the function of the decoder according to the first embodiment. Details of the function of a decoder 18-2 according to the second embodiment will be described below.

Figure 5:
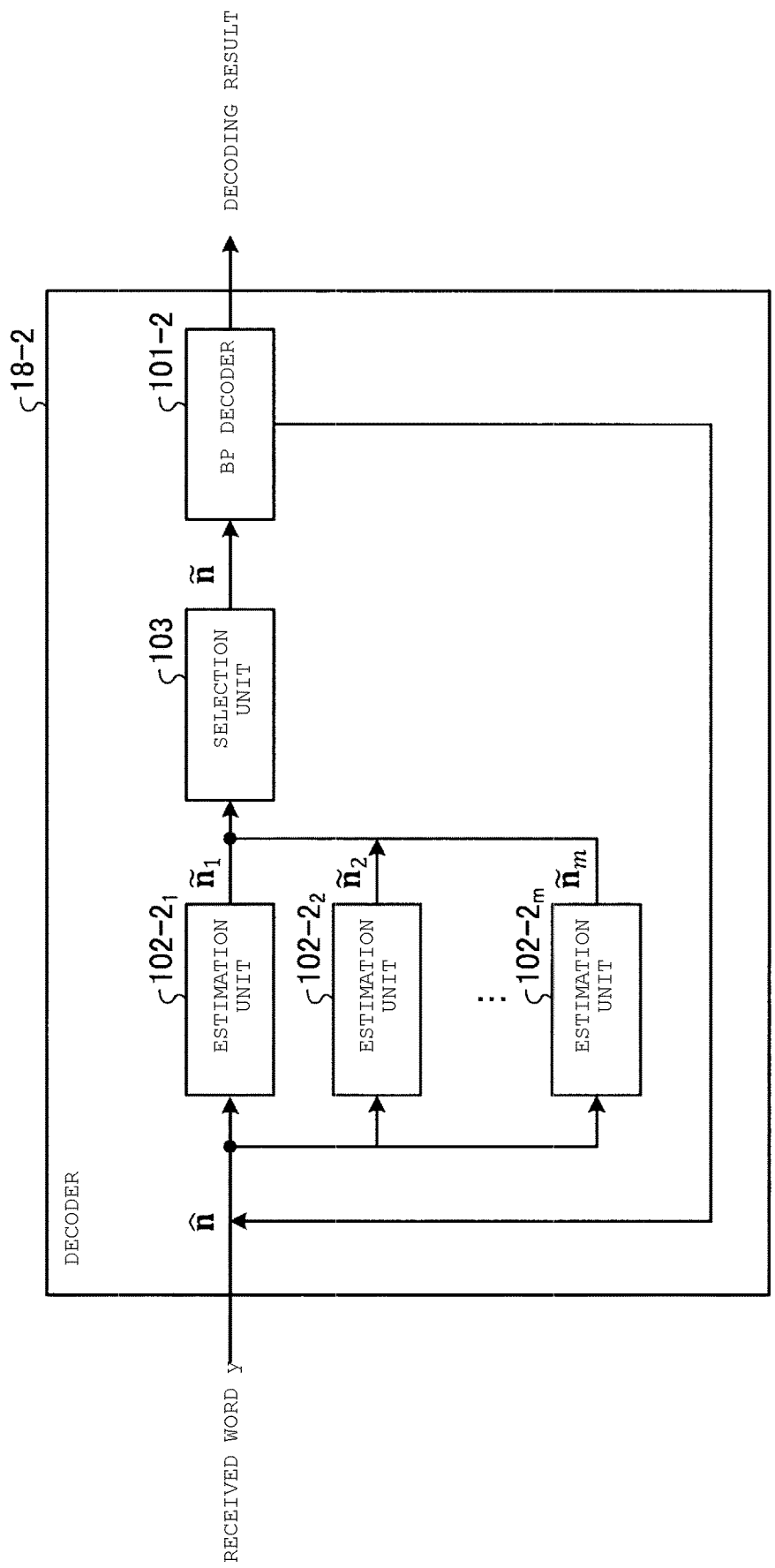
FIG. 5 is a block diagram illustrating a configuration example of a decoder according to a second embodiment.

FIG. 5 is a block diagram illustrating a configuration example of the decoder 18-2 according to at least one embodiment. As illustrated in FIG. 5, the decoder 18-2 includes estimation units $102\text{-}2_1$ to $102\text{-}2_m$, a selection unit 103, and a BP decoder 101-2. A function of the selection unit 103 is the same as the function of the selection unit according to the first embodiment, and thus, the same reference numerals are given and description thereof will be omitted.

The estimation unit $102\text{-}2_1$ to $102\text{-}2_m$ are different from the estimation units $102_1$ to $102_m$ according to the first embodiment in that noise is estimated by using a hard decision value before BP decoding is performed by a BP decoder 101-2. The hard decision value indicates whether each bit is 0 or 1. For example, the BP decoders $102\text{-}2_1$ to $102\text{-}2_m$ calculates the hard decision value as 0 when a code bit of the soft decision value is positive (+) and calculates the hard decision value as 1 when the code bit of the soft decision value is negative (−). The estimation units $102\text{-}2_1$ to $102\text{-}2_m$ estimate noise from a difference between the received word y which is a soft decision value and the calculated hard decision value. After the BP decoding is performed, the estimation units $102\text{-}2_1$ to $102\text{-}2_m$ estimate noise by using the CNN as in the first embodiment.

The BP decoder 101-2 performs decoding by using a belief-propagation method and using a received word updated by the noise estimation value selected by the selection unit 103.

After the decoding is performed by using the belief-propagation method, the estimation units $102\text{-}2_1$ to $102\text{-}2_m$ estimate a noise estimation value by inputting the noise obtained by a difference between the received word y and the decoding result $\hat{s}$ to the CNN.

Figure 6:
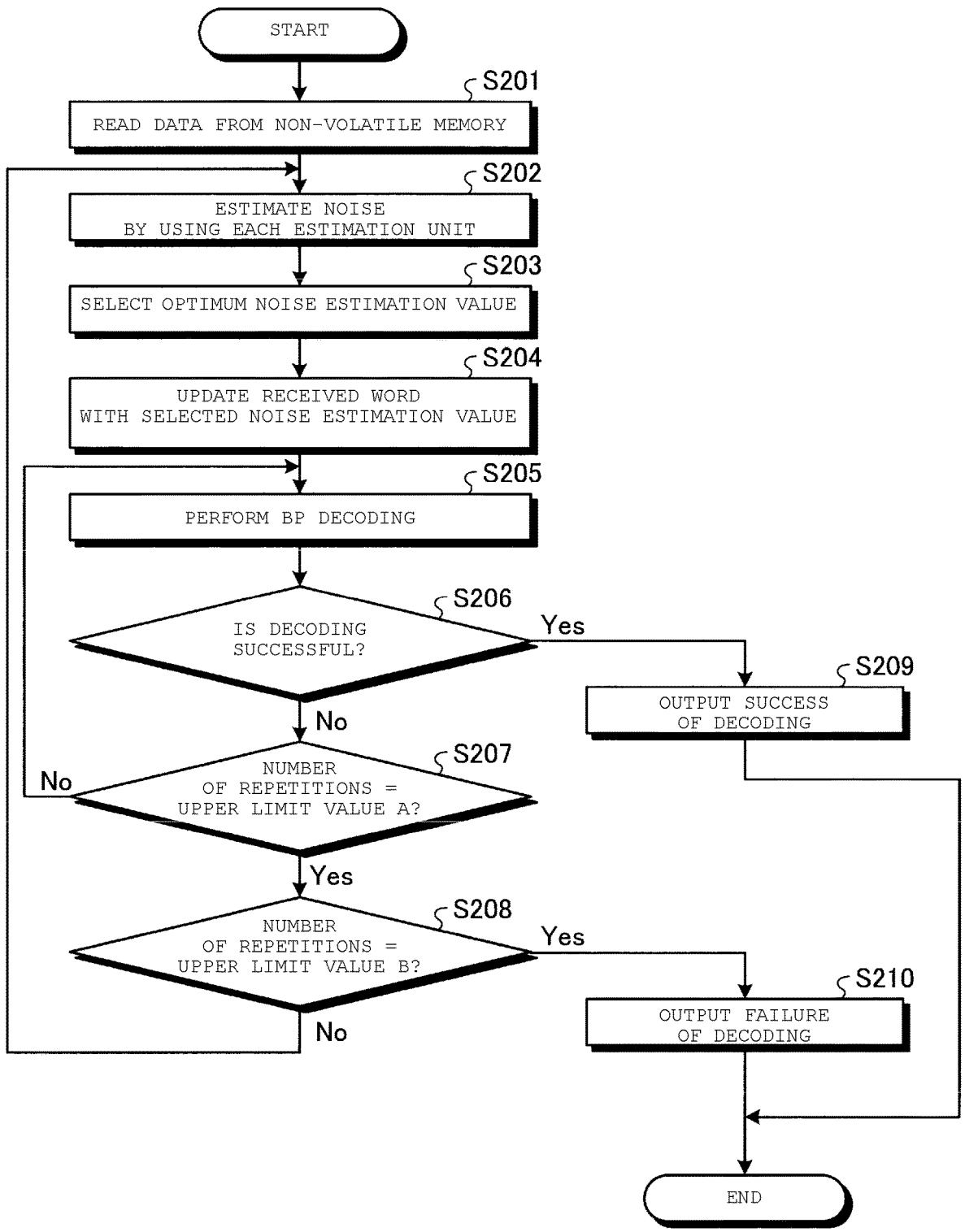
FIG. 6 is a flowchart illustrating an example of a data read processing according to the second embodiment.

FIG. 6 is a flowchart illustrating an example of a data read processing according to the second embodiment. Step S201 is the same as step S101 of FIG. 4 which illustrates a read processing according to the first embodiment.

In at least one embodiment, the estimation units $102\text{-}2_1$ to $102\text{-}2_m$ estimate noise as follows in step S202 which is a first step of repetition. First, the estimation units $102\text{-}2_1$ to $102\text{-}2_m$ calculate a hard decision value from the received word y which is a soft decision value. The estimation units $102\text{-}2_1$ to $102\text{-}2_m$ estimate noise based on a difference between the received word y and the hard decision value, and output a plurality of noise estimation values (step S202).

Steps S203 and S204 are the same as steps S106 and S107 of FIG. 4.

When a received word is updated in step S204, the BP decoder 101-2 performs decoding by using the belief-propagation method and using the updated received word (step S205). The BP decoder 101-2 determines whether or not the BP decoding is successful (step S206). When the decoding is successful (step S206: Yes), the decoder 18-2 notifies, for example, the control unit 11 of the success of decoding (step S209). The control unit 11 outputs the decoding result to the host 30 via the host I/F 15.

When the decoding fails (step S206: No), the decoder 18-2 determines whether or not the number of repetitions of BP decoding reaches the upper limit value A (step S207). If the number of repetitions of BP decoding does not reach the upper limit value A (step S207: No), the process returns to step S205, and the BP decoding is further repeated.

When the number of repetitions of BP decoding reaches the upper limit value A (step S207: Yes), the decoder 18-2 determines whether or not the number of repetitions of BP decoding reaches the upper limit value B (step S208). When the number of repetitions reaches the upper limit value B (step S208: Yes), the decoder 18-2 notifies, for example, the control unit 11 of a failure of decoding (step S210).

When the number of repetitions does not reach the upper limit value B (step S208: No), the process returns to step S202, and each of the plurality of estimation units $102\text{-}2_1$ to $102\text{-}2_m$ further performs a process of outputting a noise estimation value by using a corresponding model. In the second step S202 and subsequent steps, a noise estimation value is calculated by inputting noise (Equation (1) described above) obtained by a difference between the received word y and the decoding result sˆ to a model, as in the first embodiment.

FIG. 7 is a diagram illustrating an example of the number of repetitions of BP decoding according to the second embodiment. A horizontal axis represents a signal to noise ratio (SNR) of a received word to be processed. A vertical axis represents an average value of the number of repetitions of BP decoding when the decoding process according to the second embodiment is performed a plurality of times.

A curve 701 represents the number of repetitions until successful decoding when only BP decoding is performed with an upper limit value set to 50 times (estimation of noise and updating of a received word are not performed) according to the sequence of (S1) to (S3) described above. A curve 702 represents the number of repetitions until successful decoding when the first BP decoding (upper limit value of 25 times) is performed and then the second BP decoding (upper limit value of 25 times) is performed by using a received word updated by the noise estimated by one estimation unit. A curve 703 represents the number of repetitions until successful decoding according to the second embodiment (a configuration using two estimation units $102\text{-}2_1$ and $102\text{-}2_2$, upper limit value A=25, and upper limit value B=50) in which the number of estimation units is 2.

Models used by the two estimation units $102\text{-}2_2$ and $102\text{-}2_2$ are a model learned based on colored noise with a correlation coefficient η=0.8 between adjacent noises, and a model learned based on additive white Gaussian noise (AWGN).

According to the second embodiment, not only decoding performance can be increased, but also the number of repetitions of BP decoding until decoding is successful can be reduced as illustrated in FIG. 7.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a non-volatile memory; and
a memory controller configured to:
read a received word from the non-volatile memory,
estimate noise based on a plurality of different models for estimating the noise in the received word to provide a plurality of noise estimation values,
select one noise estimation value from the plurality of noise estimation values,
update the received word using a value obtained by subtracting the selected noise estimation value from the read received word,
decode the updated received word using a belief-propagation method,
read the received word from the non-volatile memory as a soft decision value,
obtain the plurality of noise estimation values based on the soft decision value and a hard decision value, the hard decision value calculated based on the soft decision value,
select one noise estimation value from among the plurality of obtained noise estimation values,
update the received word by a value based on subtracting the selected noise estimation value from the received word,
decode the updated received word using the belief-propagation method, and
obtain the plurality of noise estimation values using the plurality of models when decoding by the belief-propagation method fails.

2. The memory system according to claim 1,
wherein the memory controller is configured to:
decode the read received word using the belief-propagation method.

3. The memory system according to claim 1,
wherein the selection of the one noise estimation value among the plurality of noise estimation values being based on distance between a value obtained by subtracting the noise estimation value from the read received word and a most likely decoding word being less than the other noise estimation values.

4. The memory system according to claim 1,
wherein the memory controller is configured to select one noise estimation value that is smaller than the other noise estimation values among the plurality of noise estimation values.

5. The memory system according to claim 1,
wherein each of the plurality of models is a convolutional neural network (CNN).

6. The memory system according to claim 1,
wherein each of the plurality of models is learned based on different pieces of attribute information indicating attributes of the non-volatile memory.

7. The memory system according to claim 6,
wherein the attribute information includes at least one of the number of word lines, the number of blocks, or the number of pages of the non-volatile memory.

8. The memory system according to claim 1, wherein each of the plurality of models is learned based on a decoding result when a hard error is generated.

9. A method of operating a memory system including a non-volatile memory, the method comprising:
reading a received word from the non-volatile memory;
estimating noise based on a plurality of different models for estimating the noise in the received word to provide a plurality of noise estimation values;
selecting one noise estimation value from the plurality of noise estimation values,
updating the received word using a value obtained by subtracting the selected noise estimation value from the read received word,
decoding the updated received word using a belief-propagation method,
reading the received word from the non-volatile memory as a soft decision value;
obtaining the plurality of noise estimation values based on the soft decision value and a hard decision value, the hard decision value calculated based on the soft decision value;
selecting one noise estimation value from among the plurality of obtained noise estimation values;
updating the received word by a value based on subtracting the selected noise estimation value from the received word;
decoding the updated received word using the belief-propagation method, and
obtaining the plurality of noise estimation values using the plurality of models when decoding by the belief-propagation method fails.

10. The method according to claim 9, further comprising: decoding the read received word using the belief-propagation method.

11. The method according to claim 9, wherein the selecting of the one noise estimation value among the plurality of noise estimation values being based on a distance between a value obtained by subtracting the noise estimation value from the read received word and a most likely decoding word being less than the other noise estimation values.

12. The method according to claim 9, further comprising selecting one noise estimation value that is smaller than the other noise estimation values, among the plurality of noise estimation values.

13. The method according to claim 9, wherein each of the plurality of models is a convolutional neural network (CNN).

14. The method according to claim 9, wherein each of the plurality of models is learned based on different pieces of attribute information indicating attributes of the non-volatile memory.

15. The method according to claim 14, wherein the attribute information includes at least one of the number of word lines, the number of blocks, or the number of pages of the non-volatile memory.

16. The method according to claim 9, wherein each of the plurality of models is learned based on a decoding result when a hard error is generated.

* * * * *